United States Patent [19]

Simpson

[11] Patent Number: 5,527,559
[45] Date of Patent: Jun. 18, 1996

[54] METHOD OF DEPOSITING A DIAMOND FILM ON A GRAPHITE SUBSTRATE

[75] Inventor: Matthew Simpson, Sudbury, Mass.

[73] Assignee: Saint Gobain/Norton Industrial Ceramics Corp., Worcester, Mass.

[21] Appl. No.: 276,672

[22] Filed: Jul. 18, 1994

[51] Int. Cl.$^6$ ............................................. C23C 16/00
[52] U.S. Cl. ................ 427/249; 427/255.7; 427/122; 427/419.7; 264/317; 423/446; 428/408
[58] Field of Search ................. 427/249, 122, 427/255.7, 419.7; 264/317; 423/446; 428/408; 156/DIG. 68; 117/929

[56] References Cited

U.S. PATENT DOCUMENTS

| | | | |
|---|---|---|---|
| 4,471,003 | 9/1984 | Cann | 427/34 |
| 4,487,162 | 12/1984 | Cann | 118/723 |
| 4,707,384 | 11/1987 | Schnachner et al. | 427/249 |
| 4,734,339 | 3/1988 | Schachner et al. | 428/701 |
| 4,925,701 | 5/1990 | Jansen et al. | 427/38 |
| 4,987,002 | 1/1991 | Sakamoto et al. | 427/34 |
| 5,114,745 | 5/1992 | Jones | 427/249 |
| 5,130,512 | 5/1994 | Bigelow | 264/24 |
| 5,134,652 | 5/1994 | Simpson et al. | 264/81 |
| 5,139,372 | 8/1992 | Tanabe et al. | 407/118 |
| 5,180,571 | 1/1993 | Hosoya et al. | 423/446 |
| 5,183,529 | 2/1993 | Potter et al. | 156/613 |
| 5,204,144 | 4/1993 | Cann et al. | 427/569 |
| 5,221,501 | 6/1993 | Feldman et al. | 264/1.2 |

FOREIGN PATENT DOCUMENTS

| | | |
|---|---|---|
| 0467043A2 | 1/1992 | European Pat. Off. . |
| 0556615 | 8/1993 | European Pat. Off. . |
| 0653394 | 5/1995 | European Pat. Off. . |
| 60-212847 | 10/1985 | Japan . |
| 61-151097 | 7/1986 | Japan . |
| 63-307196 | 4/1989 | Japan . |
| 3-197385 | 8/1991 | Japan . |
| 2081695 | 2/1982 | United Kingdom . |

OTHER PUBLICATIONS

Database WPI Section Ch, Week 9432 Derwent Publications Ltd., London, GB; Class L02, An 94–262013 & RU–C–2 006 538 (Kompakt LTD Sock Co), 30 Jan. 1994, abstract.
Patent Abstracts of Japan vol. 013 No. 504 (C–653), 13 Nov. 1989 & JP–A–01201478 (Sumitomo Electric Ind Ltd) 14 Aug. 1989, abstract.

Primary Examiner—Roy V. King
Attorney, Agent, or Firm—Volker R. Ulbrich; Martin M. Novack

[57] ABSTRACT

A method of making a diamond film on a graphite substrate is disclosed, which comprises the steps of forming a layer of carbon-containing compound on a surface of the graphite substrate and controlling said compound to be rich or lean in carbon with respect to the stoichiometric carbon content in the compound to adjust the adherence of a diamond layer to be deposited on said layer of carbon-containing compound; and depositing a synthetic diamond layer on said layer of carbon-containing compound.

17 Claims, 2 Drawing Sheets

METHOD OF DEPOSITING A DIAMOND FILM ON A GRAPHITE SUBSTRATE

FIELD OF THE INVENTION

This invention relates to synthetic diamond and, more particularly, to a method of making synthetic diamond film.

BACKGROUND OF THE INVENTION

Diamond has a number of properties which make it attractive for use as window material, free-standing domes, or other planar and non-planar structures for various applications. Among these properties are extreme hardness and excellent transmissivity of certain radiation. Diamond is also an extraordinary heat conductor, thermally stable, and an electrical insulator. However, natural diamond is prohibitively expensive for applications which require any substantial size and is difficult to form into certain shapes.

In recent years, a number of techniques have been developed for depositing synthetic diamond on surfaces of various shapes to obtain a diamond film or coating on tool surfaces and devices. These techniques include so-called high-pressure high-temperature ("HPHT") methods and chemical vapor deposition ("CVD") methods. The CVD methods include plasma deposition techniques wherein, for example, plasmas of a hydrocarbon and hydrogen are obtained using electrical arcing. The resultant plasma can be focused and accelerated toward a substrate using focusing and accelerating magnets.

In order to obtain diamond films having shapes needed for particular applications, it is desirable to have substrates for diamond deposition that can be readily formed into the appropriate shapes. Graphite is such a material, and synthetic diamond film has been deposited, such as by chemical vapor deposition, on the surface of a graphite substrate. If necessary, the graphite can then be removed, leaving a free-standing diamond film or layer of a desired shape. Graphite can be provided that has a coefficient of thermal expansion that is relatively close to that of diamond film, and in this respect it is favorable for deposition of diamond film. However, diamond film generally does not deposit well on graphite because diamond deposition conditions tend to etch graphite, which leads to erosion of the substrate rather than deposition.

It was previously discovered that deposition of synthetic diamond on a graphite substrate can be improved by providing a thin interlayer of a metal, particularly molybdenum or tungsten. The thin layer of the metal was found to facilitate the adherence of the synthetic diamond being deposited. Although the metal does not match well with the diamond from the standpoint of thermal coefficient of expansion, use of a very thin layer of the metal minimizes the impact of such mismatch.

While coatings or interlayers of metals such as molybdenum or tungsten on graphite have been found to be generally effective, there is room for further improvement.

It is among the objects of the present invention to devise improvements in techniques for deposition of synthetic diamond film on graphite substrates.

SUMMARY OF THE INVENTION

Applicant has discovered that carbon-containing compounds (which, for purposes hereof, means solid compounds that are thermally stable above at least 500° C. and contain between 10 to 90 atomic% carbon), and especially silicon carbide, provides an advantageous and relatively inexpensive interlayer for CVD deposition of synthetic diamond on graphite. Applicant has also discovered that the degree to which the synthetic diamond adheres to the coated graphite surface can be controlled by varying the carbon content of the carbon-containing compound from which the interlayer is formed. In particular, when the interlayer is relatively rich in carbon (as compared to the stoichiometric compound), the synthetic diamond has relatively less adherence to the coated substrate, whereas when the interlayer is relatively lean in carbon (as compared to the stoichiometric compound), the synthetic diamond has relatively greater adherence to the coated graphite.

In accordance with an embodiment of the invention, there is disclosed a method of making a diamond film, which includes the steps of: providing a graphite substrate; forming a layer of a carbon-containing compound on a surface of the substrate; and depositing a synthetic diamond layer on the layer of carbon-containing compound.

In a preferred embodiment of the invention, the layer of a carbon-containing compound comprises a layer of silicon carbide. In this embodiment, the layer of silicon carbide is formed to a thickness in the range of 25 to 250 μm.

In accordance with a further feature of the invention, the step of forming said layer of carbon-containing compound comprises controlling the carbon content of said compound to adjust the adherence of said diamond layer on said layer of carbon-containing compound. The carbon content of the compound is preferably controlled to be rich or lean in carbon by at least 1 at% above or below, as the case may be, the stoichiometric carbon content.

Further features and advantages of the invention will become more readily apparent from the following detailed description when taken in conjunction with the accompanying drawings.

DETAILED DESCRIPTION

Figure 1:
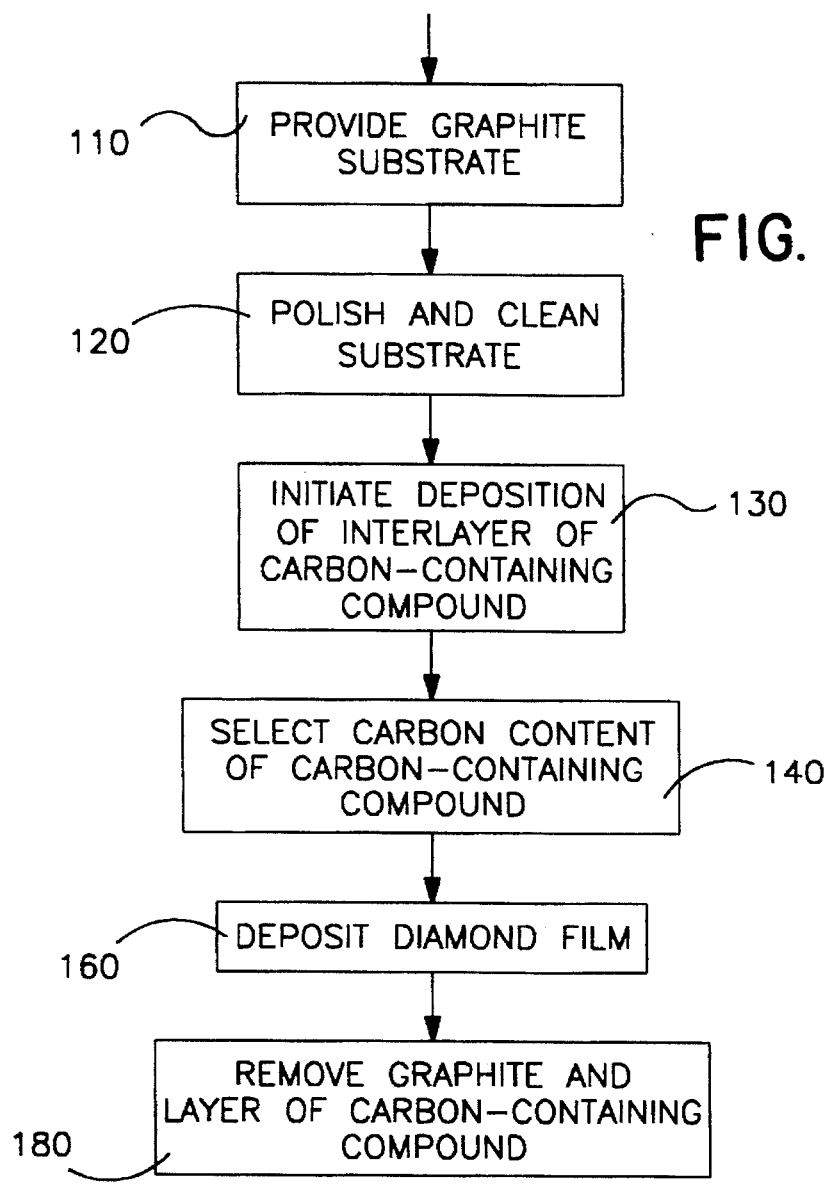
FIG. 1 is an operational flow diagram of the steps of an embodiment of the method of the invention.

Referring to FIG. 1, there is shown, an operational flow diagram of steps that can be utilized to produce synthetic diamond film in accordance with an embodiment of the invention. The block 110 represents the providing of a graphite substrate. Preferably, the graphite material will have a relatively small pore size, for example a maximum pore size less than about 10 microns. Also, the graphite chosen should preferably have a coefficient of thermal expansion which substantially matches synthetic diamond. The graphite substrate can be machined or otherwise formed into a desired shape. The block 120 represents the polishing and cleaning of the substrate surface upon which diamond film is to be deposited. Polishing can be implemented, for example, by lapping, and the surface should preferably be polished smoother than the pore size. The polished substrate surface can then be cleaned using an ultrasonic cleaner. Next, as represented by the block 130, the deposition of a layer or a carbide-containing compound, preferably silicon carbide, is initiated on the prepared graphite surface. The layer should preferably be continuous, free of pores, and seal off the pores of the polished graphite surface. It should also be relatively thin, to minimize thermal mismatch stress with regard to the diamond to be subsequently deposited. The preferred thickness is in the range of 25 to 250 microns. The silicon carbide adheres well to graphite, and good quality synthetic diamond can be deposited thereon. The silicon carbide layer can be deposited by any suitable means, for example, vapor deposition, such as CVD.

Depending on the shape, thickness, and other characteristics of the diamond to be deposited, as well as deposition parameters, it may be desirable to increase or decrease adherence of the diamond being deposited, in order to encourage or discourage release of the diamond at a particular stage of the deposition process (if the diamond is to be released) and to maximize the probability of obtaining intact diamond film. In accordance with a feature of the invention, the carbon content of the interlayer compound is selected to adjust the relative adherence of the synthetic diamond to be deposited thereon. It is the surface of the interlayer that largely controls adherence of the diamond, so the control of carbon content of the interlayer compound for the surface portion thereof, particularly the last 5 nm thereof, is more significant than the carbon content of the interlayer material below. In FIG. 1, the block 140 represents selection of the carbon-content of the interlayer carbon-containing compound, particularly the surface portion thereof.

The block 160 represents the deposition of a diamond film over the layer of silicon carbide. The diamond film is preferably deposited using a chemical vapor deposition (CVD) technique, for example the plasma jet deposition technique described in conjunction with FIG. 3. If desired, the deposited diamond film, if not previously released, can then be removed from the substrate and the interlayer, such as by grinding away the graphite and removing the interlayer (block 180).

Figure 2:
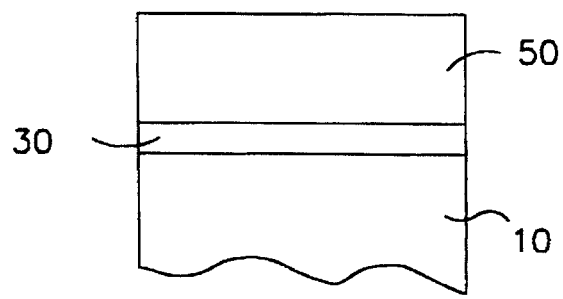
FIG. 2 illustrates a structure made in accordance with an embodiment of the invention.

FIG. 2 illustrates the structure of a graphite substrate 10 (shown planar, although it can be any shape), the carbon-containing interlayer compound 30, and the synthetic diamond layer 50.

There are various ways by which the silicon carbide interlayer of the present can be formed. One such technique is to flow mixtures of halosilanes (e.g. SiCl4), hydrocarbons (e.g. CH4) and hydrogen over the graphite to be coated, which is heated to a temperatures of order 800° C. Control of the composition of the material being deposited can be achieved by varying the ratio of Si to C in the feed gases. Alternatively, the graphite to be coated can be heated in an atmosphere containing silicon in a vapor form. The silicon is allowed to condense and react with the surface carbon to form SiC. In this technique, altering of the temperature can be used to affect the coating composition. A lower temperature will result in a coating richer in Si.

Figure 3:
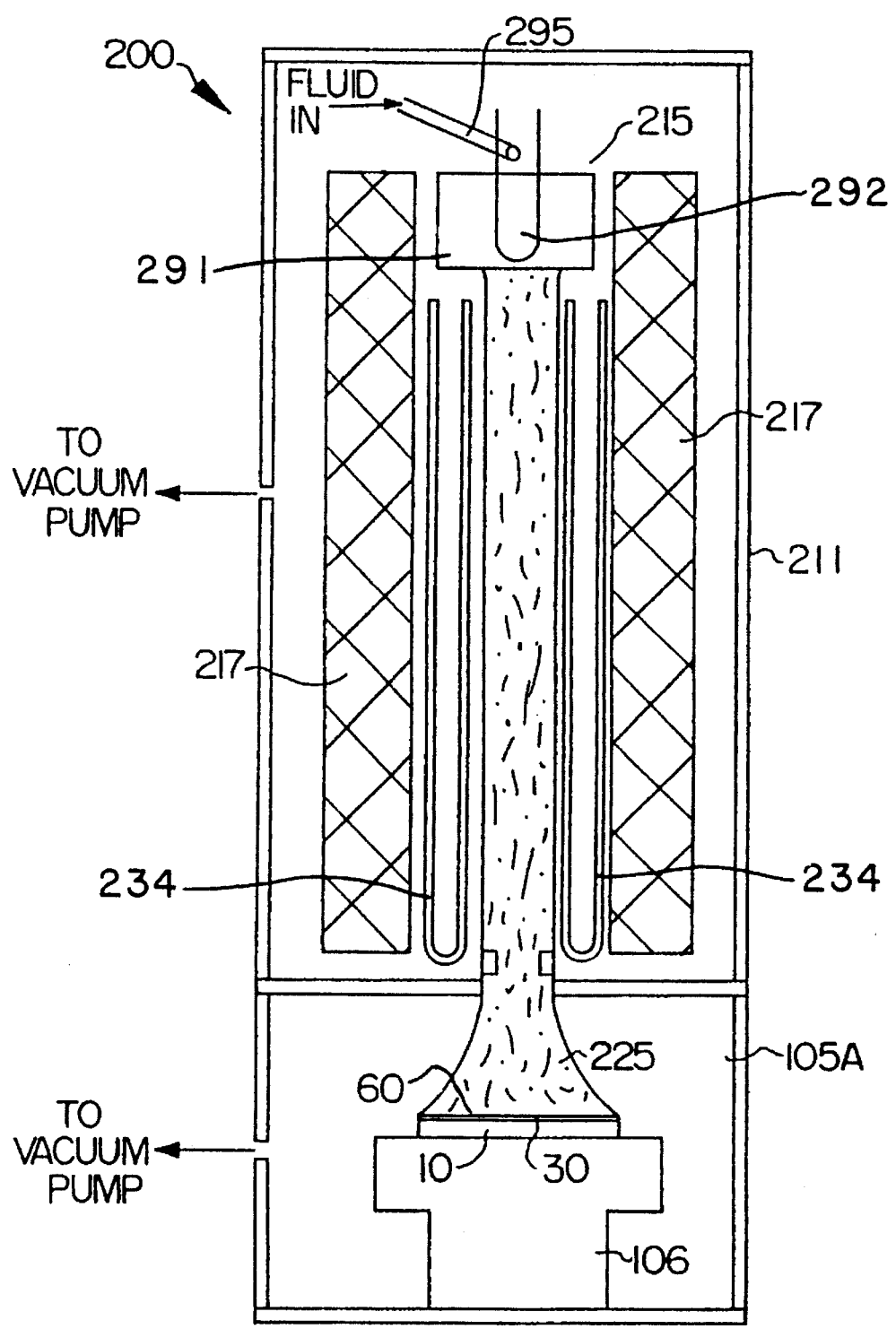
FIG. 3 is a schematic diagram of a plasma jet deposition system which can be utilized for CVD deposition of synthetic diamond for use in an embodiment of the method of the invention.

Referring to FIG. 3, there is shown a diagram of a plasma jet deposition system 200 of a type which can be utilized in practicing an embodiment of the invention. The system 200 is contained within a housing 211 and includes an arc-forming section 215 which comprises a cylindrical cathode holder 294, a rod-like cathode 292, and an injector 295 mounted adjacent the cathode so as to permit injected fluid to pass over the cathode 292. A cylindrical anode is represented at 291. In the illustrated system the input fluid may be a mixture of hydrogen and methane. The anode 291 and cathode 292 are energized by a source of electric potential (not shown), for example a DC potential. Cylindrical magnets, designated by reference numeral 217, are utilized to control the plasma generated at the arc forming section. The magnets maintain the plasma within a narrow column until the hot gases reach the deposition region 60. Optional cooling coils 234, in which a coolant can be circulated, can be located within the magnets.

In operation, a mixture of hydrogen and methane is fed to the injector 295, and a plasma is obtained in front of the arc forming section and accelerated and focused toward the deposition region. The temperature and pressure at the plasma formation region are typically in the approximate ranges 1500–15,000 degrees C. and 100–700 torr, respectively, and in the deposition region are in the approximate ranges 800–1100 degrees C. and 0.1–200 torr, respectively. As is known in the art, synthetic polycrystalline diamond can be formed from the described plasma, as the carbon in the methane is selectively deposited as diamond, and the graphite which forms is dissipated by combination with the hydrogen facilitating gas. For further description of plasma jet deposition systems, reference can be made to U.S. Pat. Nos. 4,471,003, 4,487,162, and 5,204,144. It will be understood that other suitable types of deposition equipment, including other types of CVD plasma deposition equipment, can be used in conjunction with the features of the invention.

The bottom portion 105A of the chamber has a base 106 on which can be mounted the graphite substrate 10 with the silicon carbide interlayer 30 on which the synthetic diamond is to be deposited. Reference can be made, for example, to U.S. patent application Ser. No. 07/973,994, filed Nov. 10, 1992, now U.S. Pat. No. 5,314,652, assigned to the same assignee as the present Application, which describes considerations of roughness of the substrate with regard to appropriate holding and release of the diamond during and after deposition. The base can include a temperature controller. It will be understood that other diamond deposition techniques can be used. The substrate can be tilted and rotated during deposition as described, for example, in U.S. Pat. No. 5,204,144.

EXAMPLE 1

A disk 12 cm diameter by 1.2 cm thick was fabricated from IG-11 graphite. The disk was coated with SiC using a vapor phase process, but at the end of the process, the proportion of C was adjusted to be higher than that required to achieve the SiC stoichiometry. Diamond was deposited on the coating substrate under the following conditions:

| Deposition temperature: | 925 |
|---|---|
| Pressure: | 7.3 torr |
| Enthalpy: | 45–53 kJ/g |
| % CH4: | 0.1% | until the diamond reached a thickness of about 50 um. The run was stopped and the diamond detached from the coated substrate, permitting the coated substrate to be used again. The silicon carbide coating for this example was analyzed by EDAX (energy dispersive analysis of x-rays) in an electron microscope and compared to a sample whose composition was at SiC stoichiometry. The K-alpha Si peak was reduced in intensity relative to the standard by 7.4%, suggesting that the silicon content of the surface layer was at least 7.4% lower than stoichiometric SiC; i.e., the C content was at least 53.7 at%.

EXAMPLE 2

A disk 12 cm diameter by 1.2 cm thick was fabricated from IG-11 graphite. Three fine grooves were machined into it at radii of 5, 5.3, 5.6 cm. The grooves were less than 1 mm wide and deep and served to arrest the propagation of cracks from the edge into the center. The disk was coated with SiC using a vapor phase process, but at the end of the process, the proportion of Si was adjusted to be higher than that required to achieve the SiC stoichiometry. Diamond was deposited on the coated substrate under the following conditions:

| | |
|---|---|
| Deposition temperature: | 1025–1080 |
| Pressure: | 15 torr |
| Enthalph: | 43 kJ/g |
| % CH4: | 0.15% | until the diamond reached a thickness of about 200 μm. The run was stopped and the diamond remained firmly adhered to the substrate. The diamond was examined and no cracks were found in it. The silicon carbide coating for this example was analyzed by EDAX (energy dispersive analysis of x-rays) in an electron microscope and compared to a sample whose composition was at SiC stoichiometry. The K-alpha Si peak was 26.8% more intense than the standard, suggesting that the silicon content of the surface layer was at least 63.4 at%.

EXAMPLE 3

A disk 12 cm dia by 1.2 cm thick was fabricated froma grade of graphite with expansion similar to IG-11 and coated with silicon carbide using the second of the two above-described methods. Diamond was deposited on the coated substrate under the following conditions.

| | |
|---|---|
| Deposition temperature: | 1000 C. |
| Pressure: | 8.5 torr |
| Enthalpy: | 35 kJ/g |
| % CH4: | 0.1% |

At the end of the run, a diamond coating at least 200 μm thick was formed on the substrate. It The run was stopped and the diamond remained firmly adhered to the substrate. The diamond was examined and no cracks were found in it. The coating of this example had a rougher surface than the coatings of the two previous examples, precluding a guantitative EDAX analysis. Qualitatively, the composition appeared closer to the SiC standard than the other two coatings. No other elements were detected at significant levels. Visually, the coating for example 3 looked greenish, which color is associated with relatively pure silicon carbide (Kirk-Othmer Encyclopedia of Chemical Technology, v1, p33). From this and from the EDAX analysis, we conclude this coating was close to pure SiC and hence has composition 50 at% Si, 50 at% C. The coating for example 2 (silicon rich) had a silvery color and the coating for example 1 (carbon rich) appeared darker than example 2, but still shiny. No color was evident in either coating.

I claim:

1. A method of making a diamond film, comprising the steps of:

providing a graphite substrate;

forming a layer of silicon carbide on a surface of said substrate and controlling said silicon carbide to be rich or lean in carbon with respect to the stoichiometric carbon content of silicon carbide to adjust the adherence of a diamond layer to be deposited on said layer of silicon carbide; and depositing a synthetic diamond layer on said layer of silicon carbide.

2. The method as defined by claim 1, wherein said step of forming said layer of silicon carbide comprises forming said layer of silicon carbide to a thickness in the range of 25 to 250 μm.

3. The method as defined by claim 1, wherein said diamond layer is deposited by chemical vapor deposition.

4. The method as defined by claim 2, wherein said diamond layer is deposited by chemical vapor deposition.

5. The method as defined by claim 1, further comprising removing said graphite substrate and said layer of silicon carbide from said diamond layer.

6. The method as defined by claim 1, wherein said step of controlling the carbon content of said silicon carbide comprises controlling said silicon carbide to be rich in carbon by at least 1 at% above the stoichiometric carbon content.

7. The method as defined by claim 2, wherein said step of controlling the carbon content of said silicon carbide comprises controlling said silicon carbide to be rich in carbon by at least 1 at% above the stoichiometric carbon content.

8. The method as defined by claim 1, wherein said step of controlling the carbon content of said silicon carbide comprises controlling said silicon carbide to be lean in carbon by at least 1 at% below the stoichiometric carbon content.

9. The method as defined by claim 2, wherein said step of controlling the carbon content of said silicon carbide comprises controlling said silicon carbide to be lean in carbon by at least 1 at% below the stoichiometric carbon content.

10. A method of making a diamond film, comprising the steps of:

providing a graphite substrate;

forming a layer of carbon-containing compound on a surface of said substrate, and controlling said compound to be rich or lean in carbon with respect to the stoichiometric carbon content in the compound to adjust the adherence of a diamond layer to be deposited on said layer of carbon-containing compound; and depositing a synthetic diamond layer on said layer of carbon-containing compound.

11. The method as defined by claim 10, wherein said step of forming said layer of carbon-containing compound comprises forming said layer of carbon-containing compound to a thickness in the range of 25 to 250 μm.

12. The method as defined by claim 10, wherein said diamond layer is deposited by chemical vapor deposition.

13. The method as defined by claim 10, further comprising removing said graphite substrate and said layer of carbon-containing compound from said diamond layer.

14. The method as defined by claim 10, wherein said step of controlling the carbon content of said compound comprises controlling said compound to be rich in carbon by at least 1 at% above the stoichiometric carbon content.

15. The method as defined by claim 11, wherein said step of controlling the carbon content of said compound comprises controlling said compound to be rich in carbon by at least 1 at% above the stoichiometric carbon content.

16. The method as defined by claim 10, wherein said step of controlling the carbon content of said compound comprises controlling said compound to be lean in carbon by at least 1 at% below the stoichiometric carbon content.

17. The method as defined by claim 11, wherein said step of controlling the carbon content of said compound comprises controlling said compound to be lean in carbon by at least 1 at% below the stoichiometric carbon content.

* * * * *

UNITED STATES PATENT AND TRADEMARK OFFICE
CERTIFICATE OF CORRECTION

PATENT NO. : 5,527,559
DATED : June 18, 1996
INVENTOR(S) : Matthew Simpson

It is certified that error appears in the above-indentified patent and that said Letters Patent is hereby corrected as shown below:

Column 1, line 9, insert the following new paragraph:

--The present invention was made with Government support, and the Government has certain rights in the invention.--

Signed and Sealed this

Eighteenth Day of February, 1997

Attest:

BRUCE LEHMAN

Attesting Officer          Commissioner of Patents and Trademarks